(12) United States Patent
Austin et al.

(10) Patent No.: US 8,471,595 B1
(45) Date of Patent: Jun. 25, 2013

(54) SELECTABLE DYNAMIC/STATIC LATCH WITH EMBEDDED LOGIC

(75) Inventors: John S. Austin, Winooski, VT (US); Kai D. Feng, Hopewell Junction, NY (US); Shiu Chung Ho, Essex Junction, VT (US); Zhenrong Jin, Essex Junction, VT (US); Michael R. Ouellette, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/353,383

(22) Filed: Jan. 19, 2012

(51) Int. Cl.
*G06F 7/38* (2006.01)
*H03K 19/173* (2006.01)

(52) U.S. Cl.
USPC ............. 326/46; 326/12; 326/40; 326/93

(58) Field of Classification Search
USPC ............ 326/12, 40, 46, 93–94; 327/199–203, 327/208–211, 218–219
See application file for complete search history.

(56) References Cited

U.S. PATENT DOCUMENTS

| | | | |
|---|---|---|---|
| 4,631,420 A | 12/1986 | Hollis et al. | |
| 5,425,074 A | 6/1995 | Wong | |
| 5,629,643 A | 5/1997 | Moughanni et al. | |
| 6,107,852 A * | 8/2000 | Durham et al. | ............... 327/203 |
| 6,535,433 B2 | 3/2003 | Ooishi | |
| 6,646,464 B2 | 11/2003 | Maruyama | |
| 6,667,645 B1 | 12/2003 | Fletcher et al. | |
| 6,828,838 B1 * | 12/2004 | Anshumali et al. | ........... 327/208 |
| 7,164,302 B1 | 1/2007 | Elkin | |

FOREIGN PATENT DOCUMENTS

JP 09-270677 10/1997

* cited by examiner

*Primary Examiner* — Anh Tran
(74) *Attorney, Agent, or Firm* — Gibb & Riley, LLC; David A. Cain, Esq.

(57) ABSTRACT

A selectable latch has a pair of parallel pass gates (a first parallel pass gate that receives a seed signal, and a second parallel pass gate that receives a data signal). A first latch logic circuit performs logic operations using signals output by the parallel pass gates to produce an updated data signal. An additional pass gate is operatively connected to the first latch logic circuit. An additional pass gate controls passage of the updated data signal. The output of the parallel pass gates and the additional pass gate is connected to a feedback loop. The feedback loop operates as a dynamic latch for high frequency applications or as a static latch for low frequency applications. Thus, the selectable latch comprises two inputs into the pair of parallel pass gates and performs only one of four logical operations on a received data signal.

12 Claims, 11 Drawing Sheets

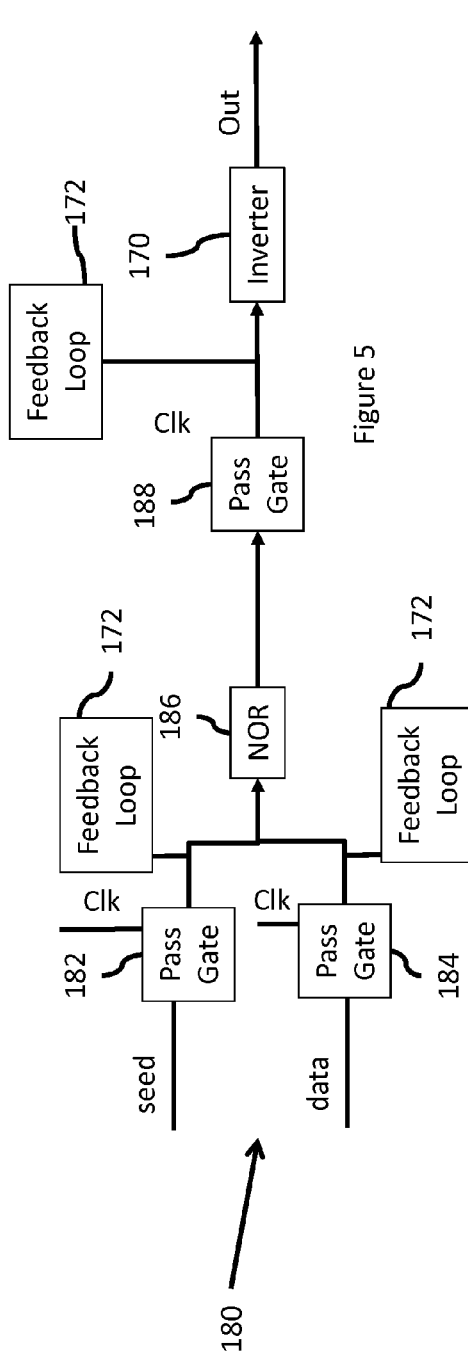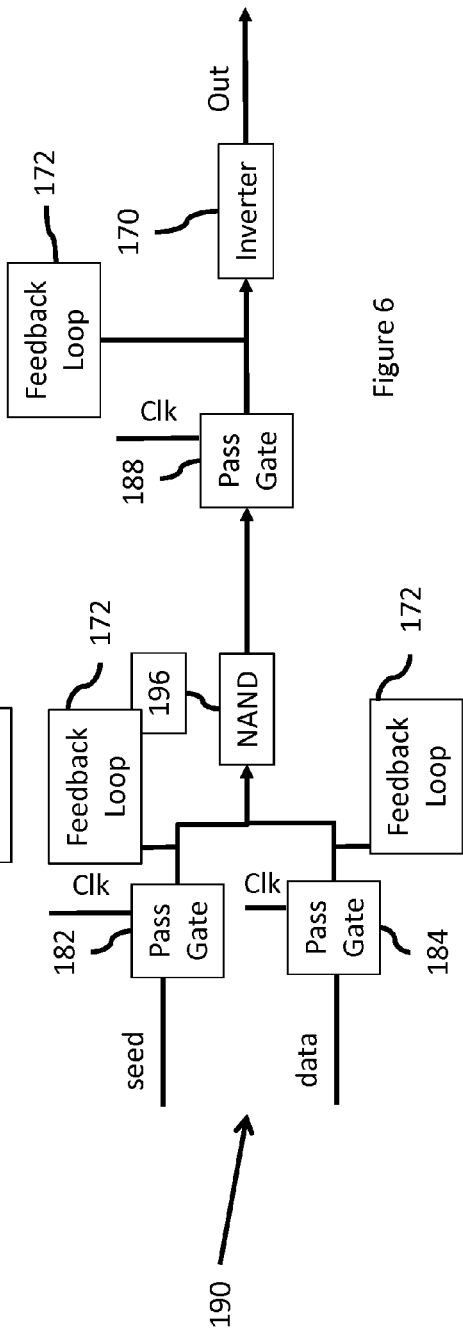
Figure 5
Figure 6

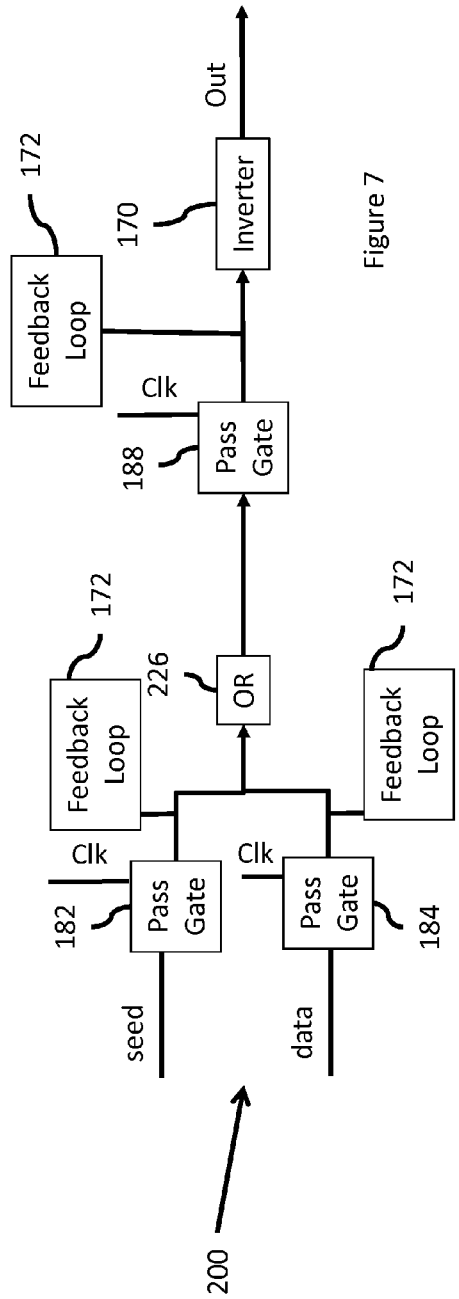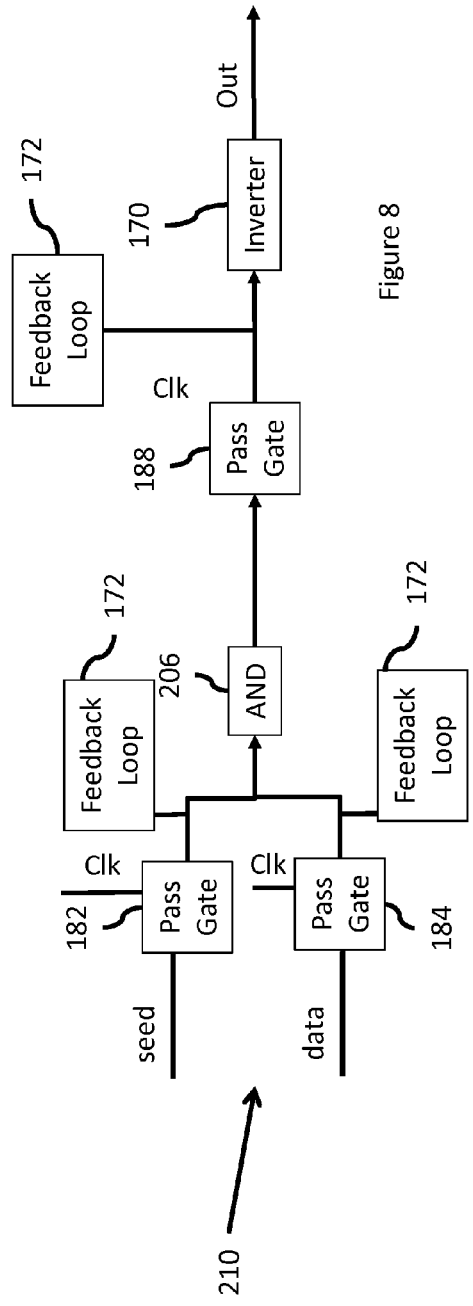

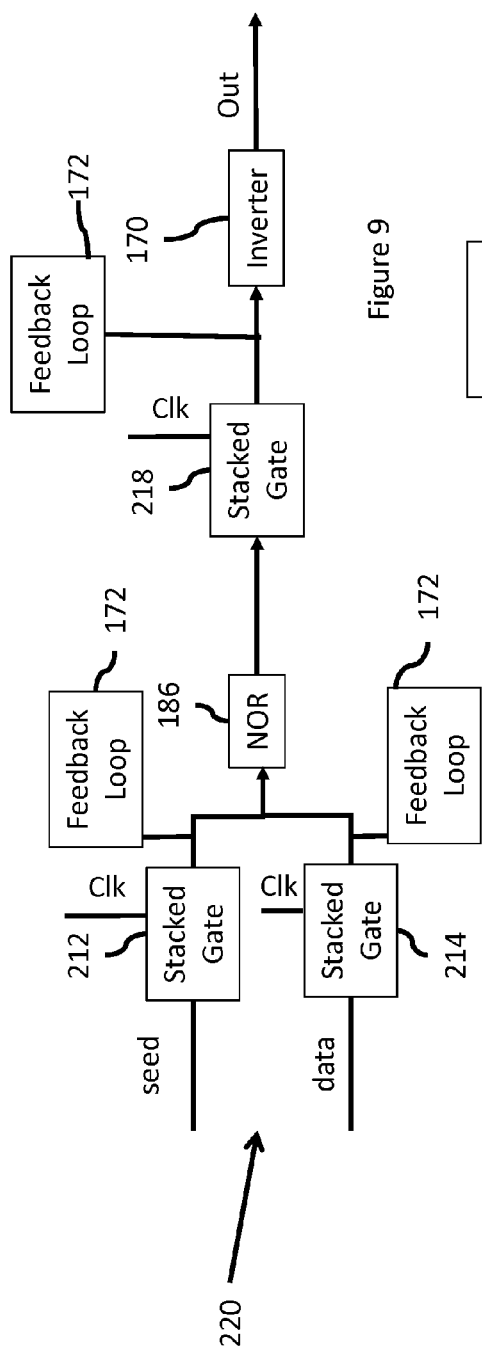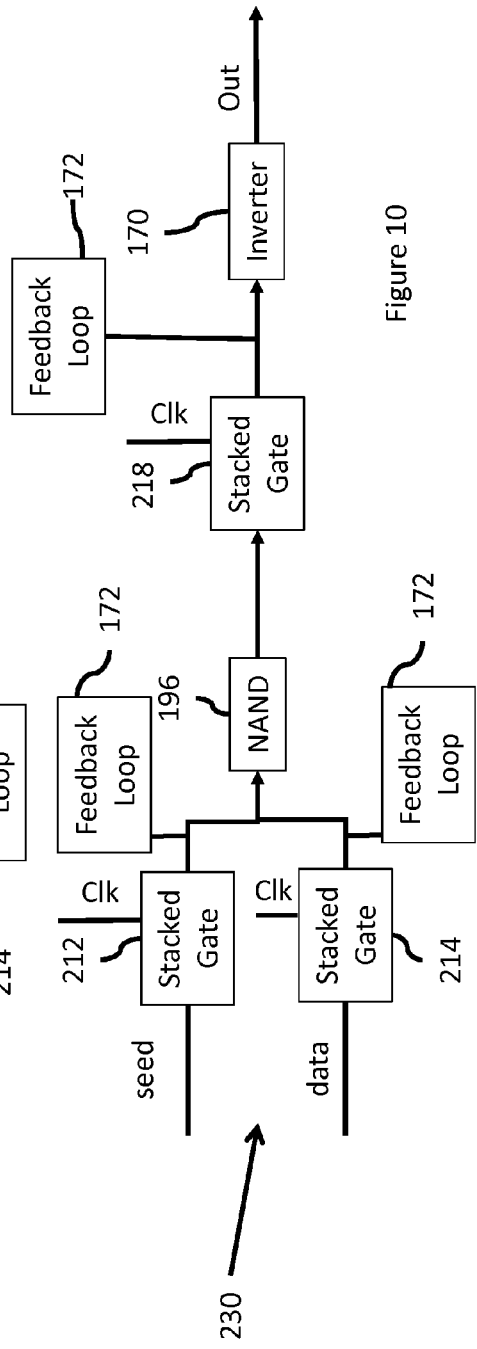

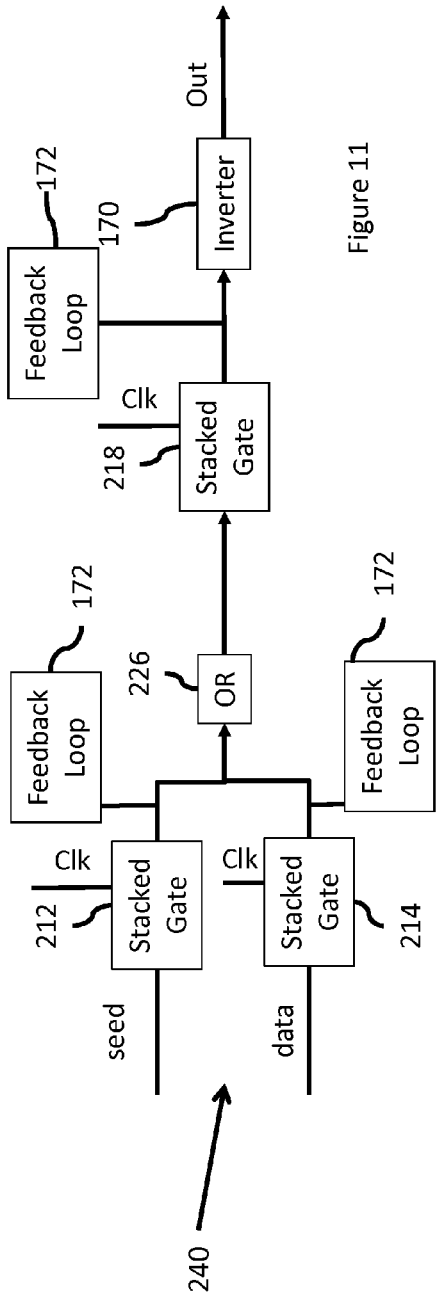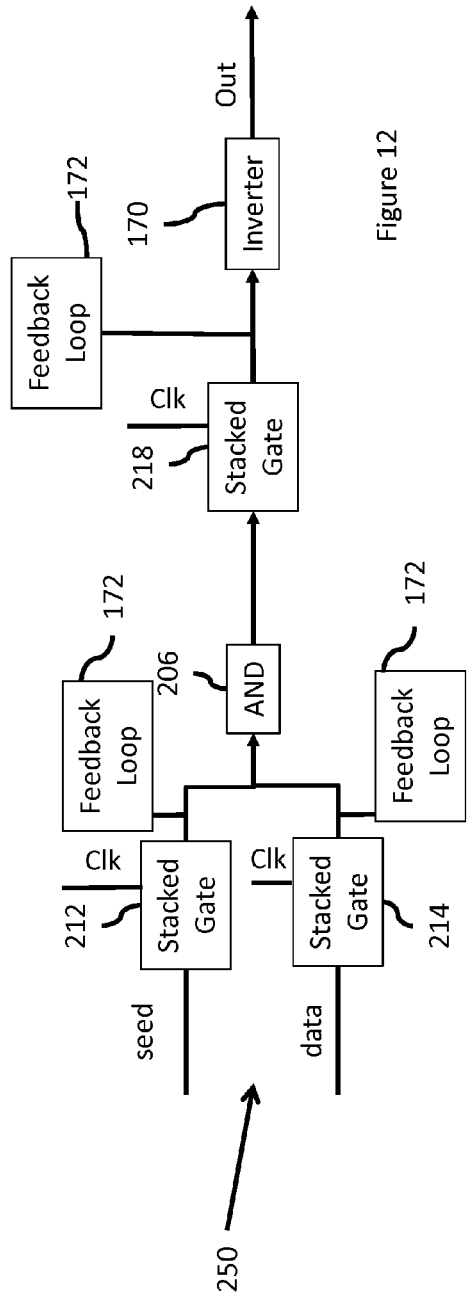

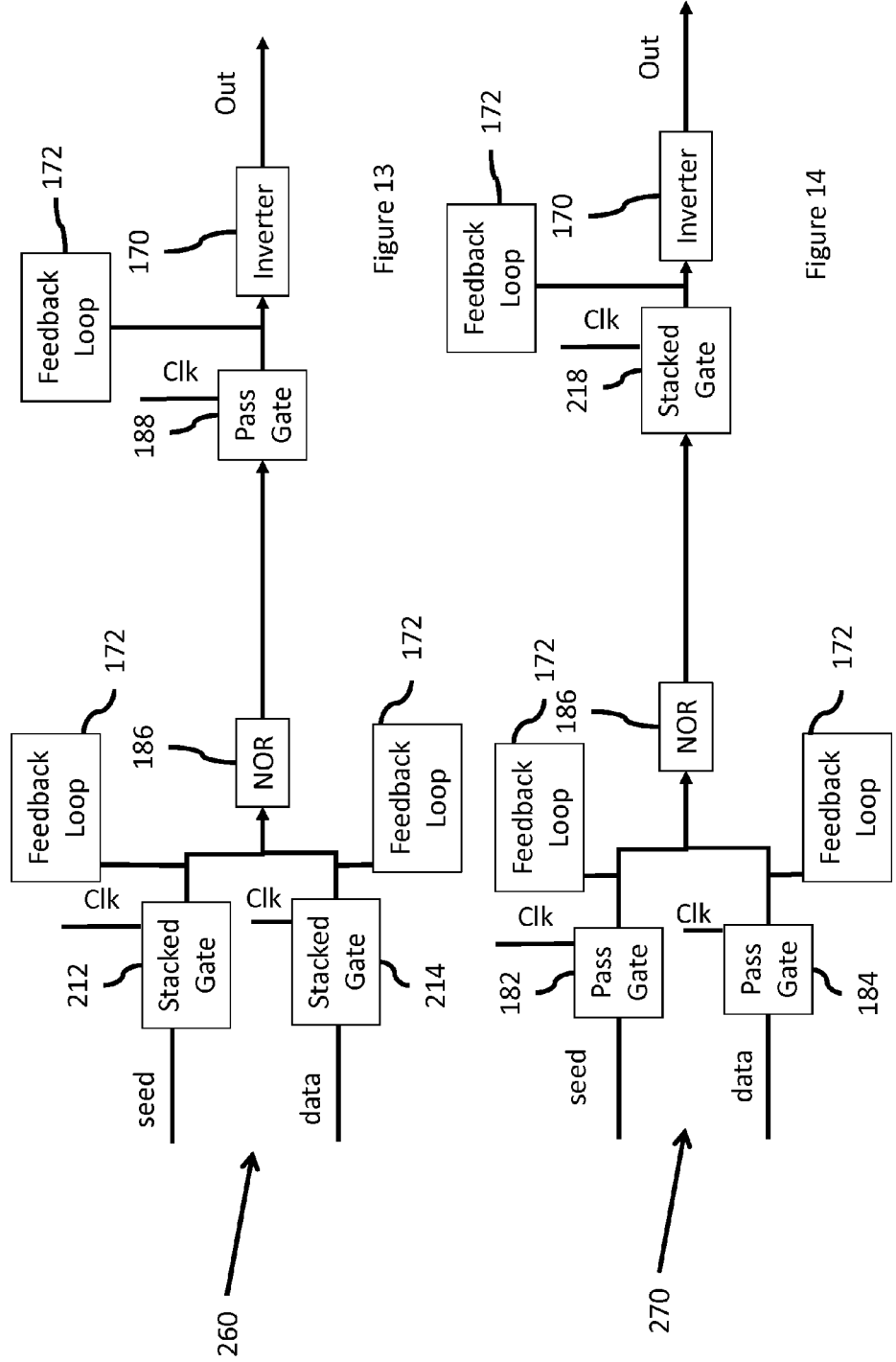

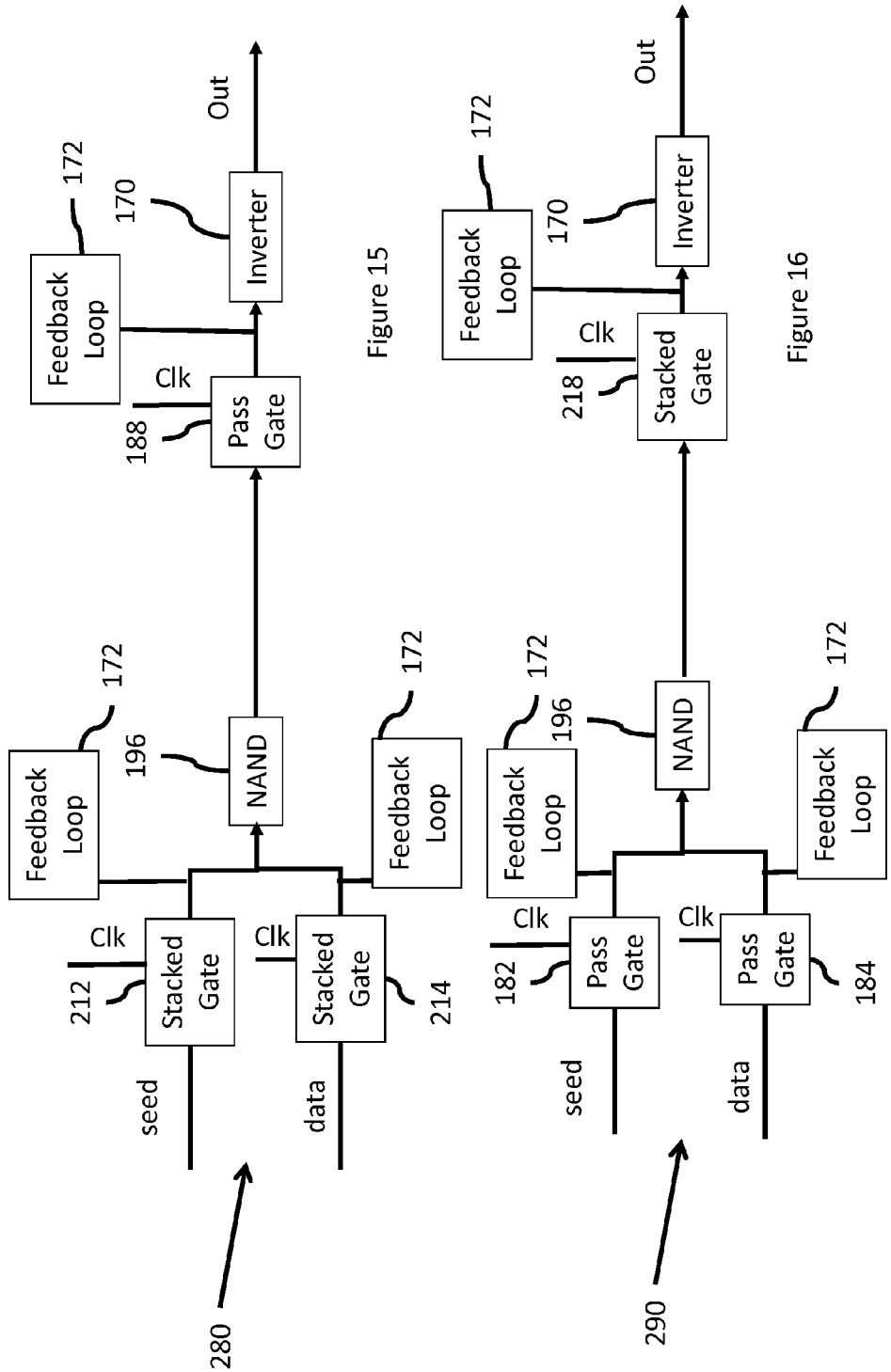

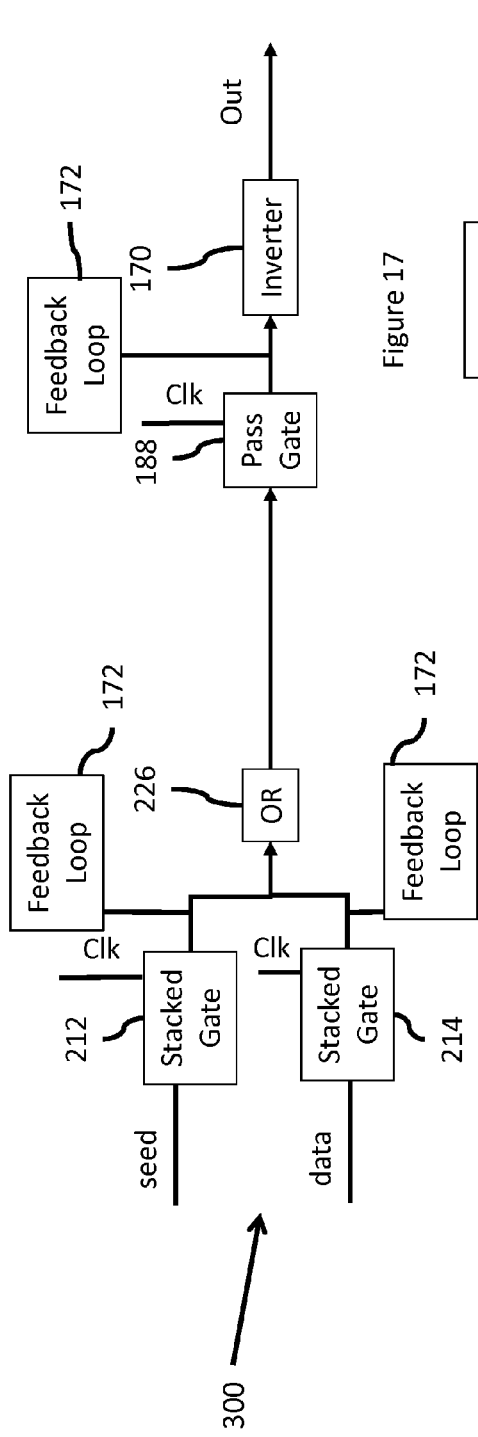
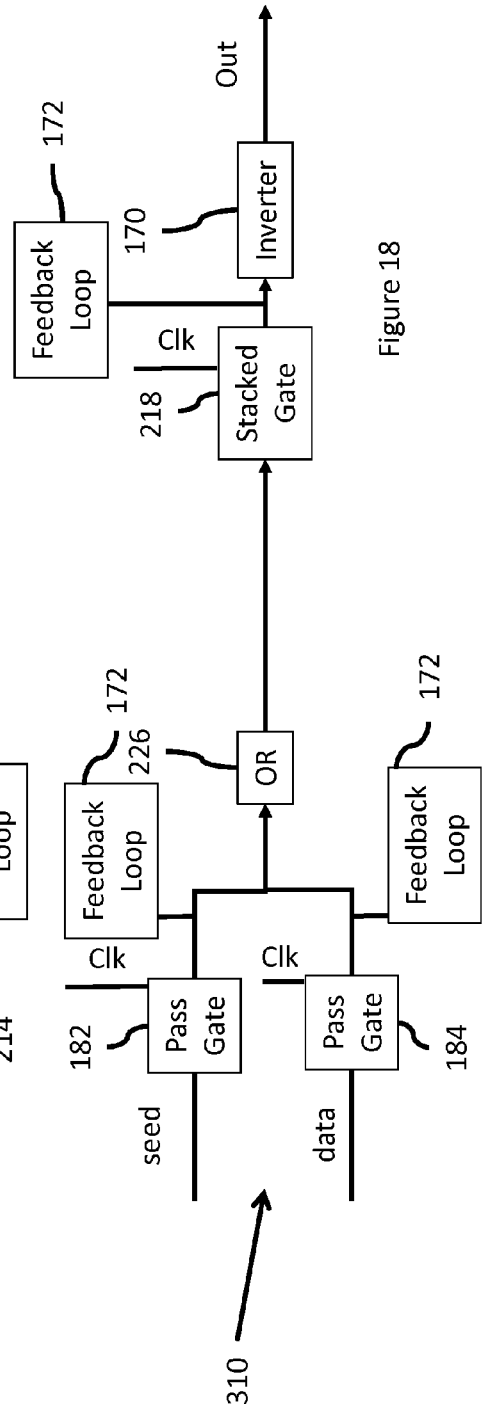

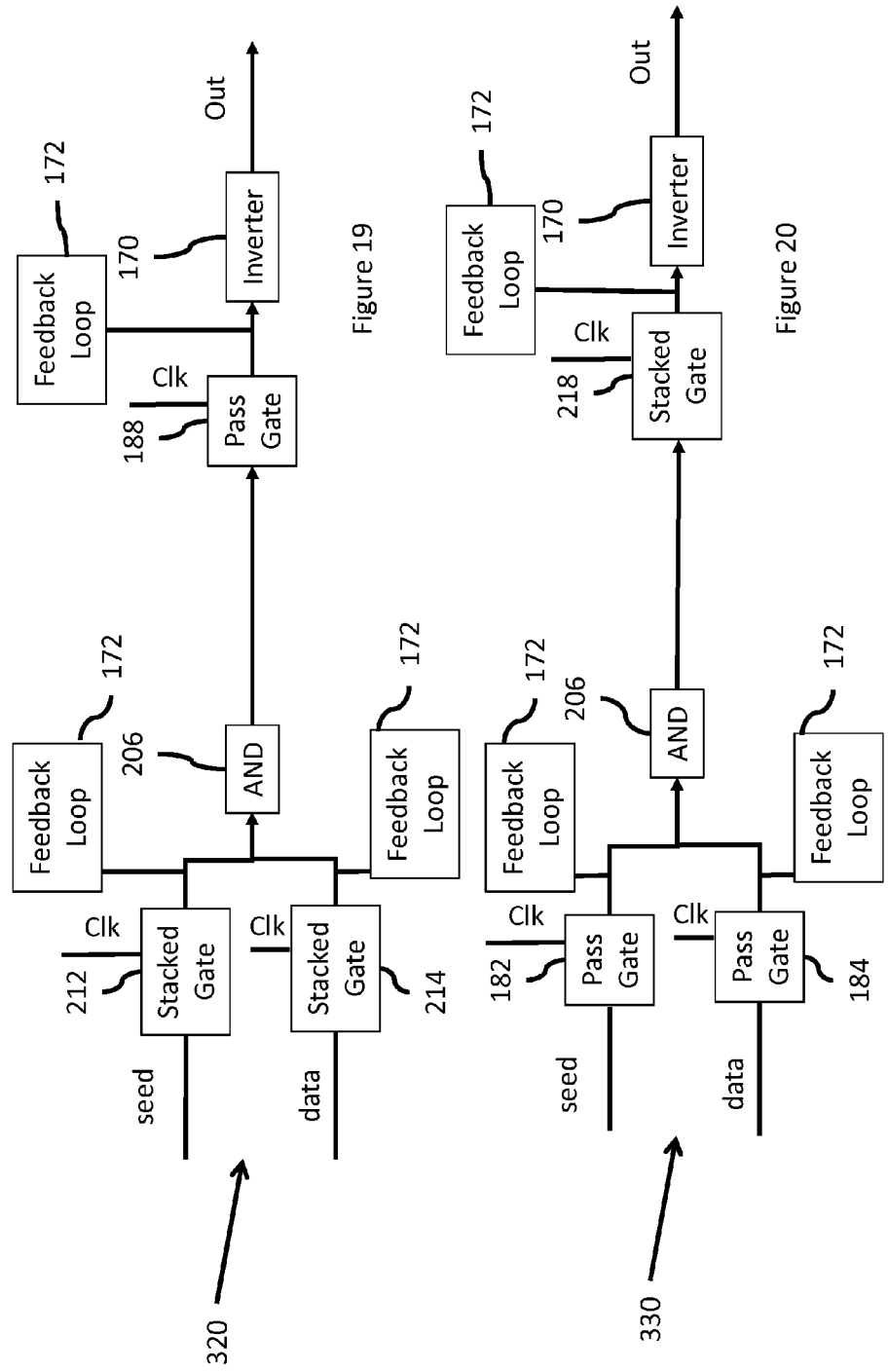

SELECTABLE DYNAMIC/STATIC LATCH WITH EMBEDDED LOGIC

BACKGROUND

The present disclosure relates to a programmable divider used in a phase lock loop (PLL) circuit, and more specifically, to a divider that has selectable latches having a dynamic mode and a static mode, each of which has two inputs (into a pair of parallel pass gates) and performs one of four logical operations on a received data signal. The latch in dynamic mode is suitable for high-speed applications while the latch in static mode is suitable for low speed applications. The latch in static mode also has better soft error rate (SER) tolerance. A unified latch with selectable modes in the disclosure can take advantage of both dynamic and static latches, and hence allows a circuit to operate across wide range of frequencies.

A linear feedback shift register (LFSR) is a shift register whose input bit is a linear function of its previous state. The initial value of the LFSR is called the seed, and because the operation of the register is deterministic, the stream of values produced by the register is determined by its current (or previous) state. Likewise, because the register has a finite number of possible states, it must eventually enter a repeating cycle.

Applications of LFSRs include generating pseudo-random numbers, pseudo-noise sequences, fast digital counters, and whitening sequences. Both hardware and software implementations of LFSRs are common. One example of such use is in a divider of a phase lock loop (PLL). A PLL is a device that generates an output signal whose phase is related to the phase of the input "reference" signal. The PLL compares the phase of the input signal with the phase of the signal derived from its output oscillator using a feedback loop and adjusts the frequency of its oscillator to keep the phases matched. The feedback loop usually includes a divider, which is referred to herein as a feedback divider to distinguish it from other dividers. Such a feedback divider can effectively use LFSRs.

SUMMARY

One exemplary embodiment herein provides a phase lock loop that includes a phase frequency detector (which is sometimes referred to herein as a phase difference detector) that receives a reference clock signal and a PLL feedback signal and outputs a phase difference signal. A charge pump is operatively connected to (directly or indirectly connected to) the phase difference detector. The charge pump receives the phase difference signal and outputs an altered signal. A low pass filter is operatively connected to the charge pump. The low pass filter receives the altered signal and outputs a filtered signal. A voltage-controlled oscillator is operatively connected to the low pass filter. The voltage-controlled oscillator receives the filtered signal and outputs a waveform signal. A first divider is operatively connected to the voltage-controlled oscillator. The first divider receives the waveform signal and outputs a PLL output signal.

A PLL feedback circuit is operatively connected to the phase difference detector and the first divider. The PLL feedback circuit includes a feedback divider that receives the PLL output signal from the first divider and outputs the PLL feedback signal to the phase difference detector.

The feedback divider includes a number of latches, one of which is referred to herein as a "first selectable" latch. A "selectable" latch has a dynamic mode for use in high frequency applications and a static mode for use in low frequency applications. The first selectable latch receives the PLL output signal as a PLL clock signal from the first divider (every latch in the divider receives a signal from the first divider). Additionally, the first selectable latch receives a feedback signal, which is a logic combination of outputs of the last two latches, and a seed signal. The seed signals comprise a phase lock loop input signal gated by a seed-loading signal. The seed signals provide an initial data value to each of the latches in the feedback divider. The first selectable latch outputs a first data signal.

Additionally, the feedback divider includes a logic circuit that is operatively connected to the first selectable latch. The logic circuit receives the first data signal and a feedback signal from a generic latch. The input of the generic latch is a logic combination of outputs of the last two latches; the logic circuit outputs a first logic signal. Another latch, referred to as a "second selectable" latch is operatively connected to the logic circuit. The second selectable latch receives the first logic signal from the logic circuit and outputs a second data signal.

Further, a plurality of serially connected selectable latches is included in the feedback divider. Each of the serially connected selectable latches receives the seed signal and the PLL clock signal. A third selectable latch receives the second data signal from the second selectable latch and outputs a third data signal to another of the selectable latches. Each of the serially connected selectable latches receives and forwards additional data signals to subsequent serially connected selectable latches in series. The second-to-last selectable latch in the series outputs a fourth data signal to a last selectable latch in the series. The last selectable latch receives the fourth data signal and outputs a fifth data signal. A first feedback loop receives the fourth data signal from the second-to-last selectable latch and the fifth data signal from the last selectable latch. The first feedback loop comprises a NAND circuit that combines the fourth and fifth data signals and the first feedback loop outputs the first feedback signal. Further, a second feedback loop receives the fourth data signal from the second-to-last selectable latch and the fifth data signal from the last selectable latch. The second feedback loop comprises a NOR circuit that combines the fourth and fifth data signals, and a conventional generic latch. The second feedback loop outputs the second feedback signal.

Each of the selectable latches mentioned above has a pair of parallel pass gates. These parallel pass gates include a first parallel pass gate that receives the seed signal, and a second parallel pass gate that receives a data signal. The data signal is a received data signal output by a previous latch or feedback circuit in the feedback divider. The pass gates are also connected to output from the first divider (this is actually the clock signal), and the clock signal either opens or closes the pass gates. The output of each of the parallel pass gates is connected to a feedback loop. This feedback loop includes an inverter operatively connected to a clock controlled gate and a mode selection gate that operates as a dynamic latch for high frequency applications or as a static latch for low frequency applications.

In each of these selectable latches, a first latch logic circuit is operatively connected to the parallel pass gates. The first latch logic circuit performs logic operations using signals output by the parallel pass gates to produce an updated data signal. An additional pass gate is operatively connected to the first latch logic circuit. The additional pass gate controls passage of the updated data signal. The output of the additional pass gate is connected to a feedback loop. The feedback loop operates as a dynamic latch for high frequency applications or as a static latch for low frequency applications. Further, an inverter is operatively connected to the additional pass gate. The inverter receives the updated data signal from the pass gate, and inverts and outputs the updated data signal as an output data signal. The clock signal connected to the parallel pass gates is a true clock signal that has the same polarity as the PLL clock signal from the first divider, and the clock signal connected to the additional pass gate is a complement clock signal that has the opposite polarity as the PLL clock signal from the first divider, or vice versa.

Thus, each of the selectable latches comprises two inputs into the pair of parallel pass gates, and performs only one of four logical operations on a received data signal (AND, OR, NAND, and, NOR). The four logical operations are performed using the signals applied to the two inputs.

BRIEF DESCRIPTION OF THE SEVERAL VIEWS OF THE DRAWINGS

The embodiments of the disclosure will be better understood from the following detailed description with reference to the drawings, which are not necessarily drawn to scale and in which:

FIG. 5 is a schematic diagram of a selectable latch used in the feedback divider shown in FIG. 2;

FIG. 6 is a schematic diagram of a selectable latch used in the feedback divider shown in FIG. 2;

FIG. 7 is a schematic diagram of a selectable latch used in the feedback divider shown in FIG. 2;

FIG. 8 is a schematic diagram of a selectable latch used in the feedback divider shown in FIG. 2;

FIG. 9 is a schematic diagram of a selectable latch used in the feedback divider shown in FIG. 2;

FIG. 10 is a schematic diagram of a selectable latch used in the feedback divider shown in FIG. 2;

FIG. 11 is a schematic diagram of a selectable latch used in the feedback divider shown in FIG. 2;

FIG. 12 is a schematic diagram of a selectable latch used in the feedback divider shown in FIG. 2;

FIG. 13 is a schematic diagram of a selectable latch used in the feedback divider shown in FIG. 2;

FIG. 14 is a schematic diagram of a selectable latch used in the feedback divider shown in FIG. 2;

FIG. 15 is a schematic diagram of a selectable latch used in the feedback divider shown in FIG. 2;

FIG. 16 is a schematic diagram of a selectable latch used in the feedback divider shown in FIG. 2;

FIG. 17 is a schematic diagram of a selectable latch used in the feedback divider shown in FIG. 2;

FIG. 18 is a schematic diagram of a selectable latch used in the feedback divider shown in FIG. 2;

FIG. 19 is a schematic diagram of a selectable latch used in the feedback divider shown in FIG. 2; and FIG. 20 is a schematic diagram of a selectable latch used in the feedback divider shown in FIG. 2.

DETAILED DESCRIPTION

As mentioned above, a feedback loop in a PLL usually includes a feedback divider. In order to support higher speeds, it is desirable to have a high-speed programmable feedback divider in the PLL to divide a high frequency clock down to a reference clock frequency domain. This disclosure introduces a high frequency low power programmable divider in complementary metal oxide semiconductor (CMOS) technology.

The disclosure describes parallel seed data latches, and implementation of the latches in a linear feedback shift register (LFSR) based high frequency programmable divider with a large divide ratio. The disclosure also describes circuit architecture for a high-speed programmable divider.

Figure 1:
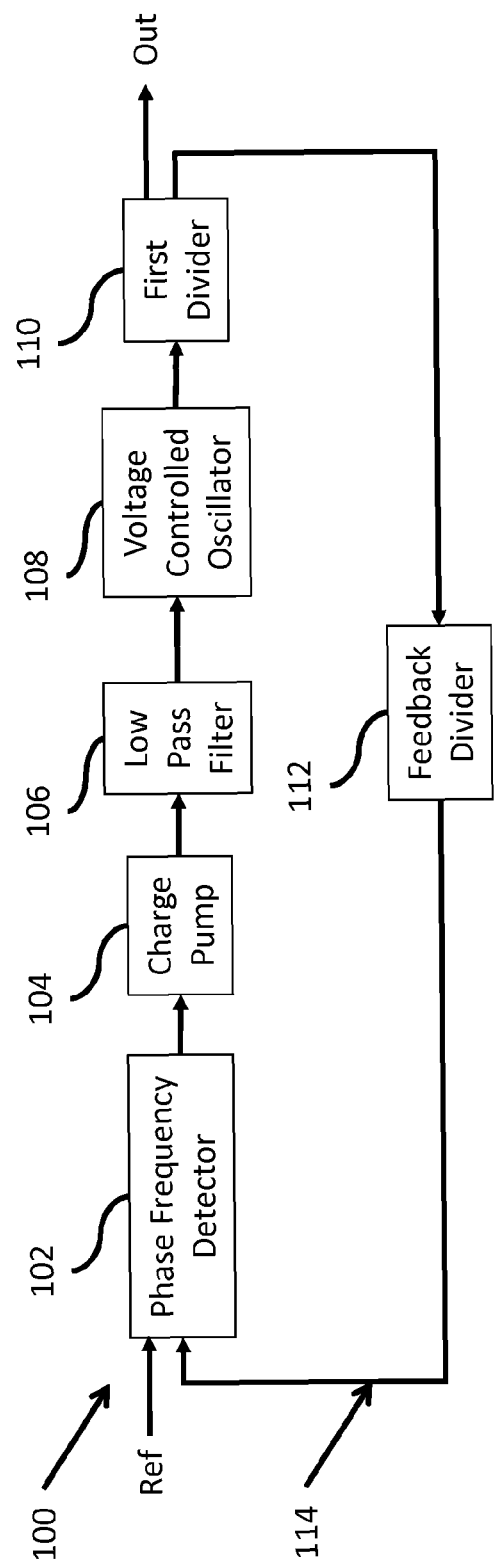
FIG. 1 is a schematic diagram of a PLL.

FIG. 1 illustrates one exemplary embodiment herein that provides a phase lock loop 100 that includes a phase frequency detector 102 (that is sometimes referred to herein as a phase difference detector). The phase frequency detector 102 receives a reference clock signal and a feedback signal and outputs a phase difference signal. The phase difference signal represents the phase difference between the reference clock signal and the feedback signal.

A charge pump 104 is connected to the phase frequency detector 102. The charge pump switches according to the phase difference signal to steer current into (or from) capacitors, causing voltage across the capacitors to increase (or decrease) with changes in the phase difference signal. In each cycle, the time during which the switch is turned on is proportional to the phase difference of the phase difference signal. Therefore, the charge pump 104 receives the phase difference signal and outputs a signal that is referred to herein as an "altered signal." A low pass filter 106 is connected to the charge pump 104. Low pass filters allow low frequency signals to pass, and reduce the amplitude of frequencies that are above a frequency cutoff. The low pass filter 106 receives the altered signal and outputs a filtered signal.

A voltage-controlled oscillator 108 is connected to the low pass filter 106. The voltage on the capacitor(s) of the charge pump 104 (as filtered by the low pass filter 106) tune the voltage controlled oscillator 108 to control the oscillating signal being output from the voltage controlled oscillator. Therefore, the voltage-controlled oscillator 108 receives the filtered signal and outputs what is sometimes referred to herein as a waveform signal. A divider 110 is connected to the voltage-controlled oscillator 108 to divide the waveform signal by any desired division factor (such as divide by 2, 4, 8, etc.). The divider 110 receives the waveform signal and outputs the divided signal, which is sometimes referred to herein as a phase lock loop output signal 100.

A PLL feedback circuit 114 is also connected between the divider 110 and the frequency phase detector 102. The PLL feedback circuit 114 includes a feedback divider 112 that receives the phase lock loop signal output from the divider 110 and outputs a PLL feedback signal to the phase frequency detector 102.

Figures 2, 3:
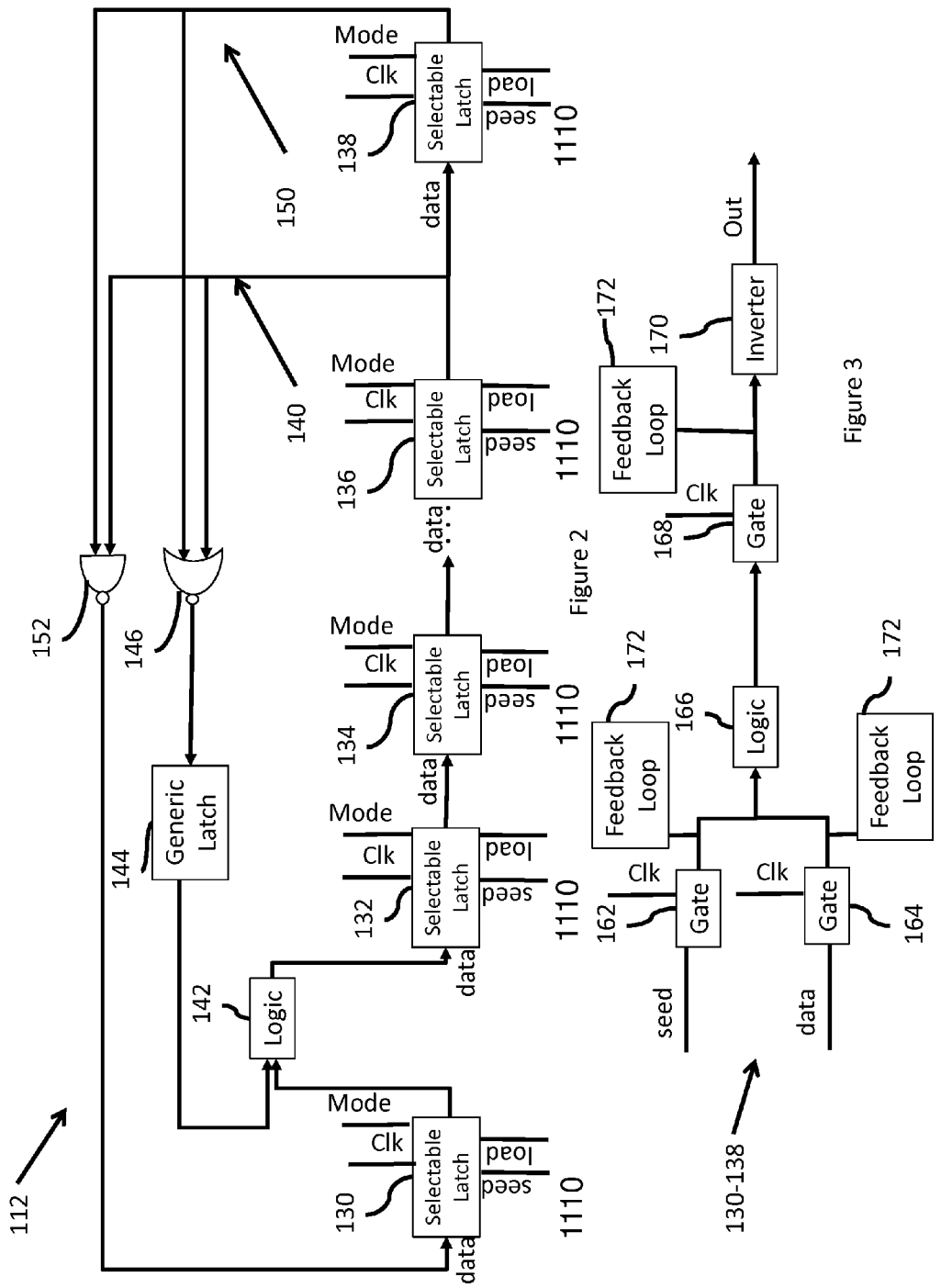
FIG. 2 is a schematic diagram of a feedback divider used in the PLL shown in FIG. 1.
FIG. 3 is a schematic diagram of a selectable latch used in the feedback divider shown in FIG. 2.

The feedback divider 112 shown in FIG. 2 is a high frequency CMOS programmable divider that includes a number of selectable latches, one of which is referred to herein as a "first selectable" latch 130. The details of the first selectable latch 130 are shown in FIG. 3, which is discussed below. The first selectable latch 130 receives the PLL output signal from the first divider 110 as a PLL clock signal. For purposes herein, the PLL output signal is used as a PLL clock signal by all the latches in the feedback divider 112. Additionally, the first selectable latch 130 receives a first feedback signal, which is a logic combination of outputs of last two latches (discussed below), and a seed signal (e.g., "1110"). The seed signal can be input to the phase lock loop from an external source gated by a "load" signal as described below. The seed signal provides an initial data value to each of the latches in the feedback divider 112. There may be only one seed signal, or there may be many different seed signals. Using these inputs, the first selectable latch outputs a first data signal.

Additionally, the feedback divider 112 includes a logic circuit 142 that is operatively connected to the first selectable latch. This logic circuit 142 can be a NAND, NOR, AND, OR, etc., circuit depending upon specific implementation. The logic circuit 142 receives the first data signal and a second feedback signal, which is a logic combination of outputs of the last two latches, and outputs a first logic signal.

Another latch, referred to as a second selectable latch 132 is operatively connected to the logic circuit 142. The details of the second selectable latch 132 are shown in FIG. 3, which is discussed below. The second selectable latch 132 receives one of the seed signals and the first logic signal (which is shown as a "data" signal in the drawings) from the logic circuit 142 and outputs a second data signal.

Further, a plurality of serially connected selectable latches 134, 136, 138, etc., are included in the feedback divider 112. The details of the selectable latches 134, 136, 138 are shown in FIG. 3, which is discussed below. Each of the serially connected selectable latches 134-138 receives one of the seed signals, the PLL clock signal, and a data signal from a previous latch.

A third selectable latch 134 receives the second data signal from the second selectable latch 132 and outputs a third data signal to another selectable latch (there can be many selectable latches between item 134 and 138). Each of the serially connected selectable latches 134-138 receives and forwards additional data signals to subsequent serially connected selectable latches in series. The second-to-last selectable latch 136 in the series outputs a fourth data signal to a last selectable latch 138 in the series. The last selectable latch 138 receives the fourth data signal and outputs a fifth data signal. A first feedback loop 150 receives the fourth data signal from the second-to-last selectable latch 136 and the fifth data signal from the last selectable latch 138. The first feedback loop 150 comprises a NAND circuit 152 that combines the fourth and fifth data signals and the first feedback loop 150 outputs the first feedback signal. Further, a second feedback loop 140 receives the fourth data signal from the second-to-last selectable latch 136 and the fifth data signal from the last selectable latch 138. The second feedback loop 140 comprises a NOR circuit 146 that combines the fourth and fifth data signals, and a conventional generic latch 144. The second feedback loop outputs the second feedback signal.

In the feedback divider 112, the divide ratio is controlled by a set of binary codes called seeds. When all outputs of latches are high, the seeds are activated by a "load" signal and the seeds are loaded to latches to set a state for the LFSR. The LFSR then walks though its state space until the "all 1 s" state is again reached and "load" signal resets the state again. The selectable latches embed logic functions inside the latches and hence effectively reduce setup time and improve the speed of the feedback divider.

Figure 4:
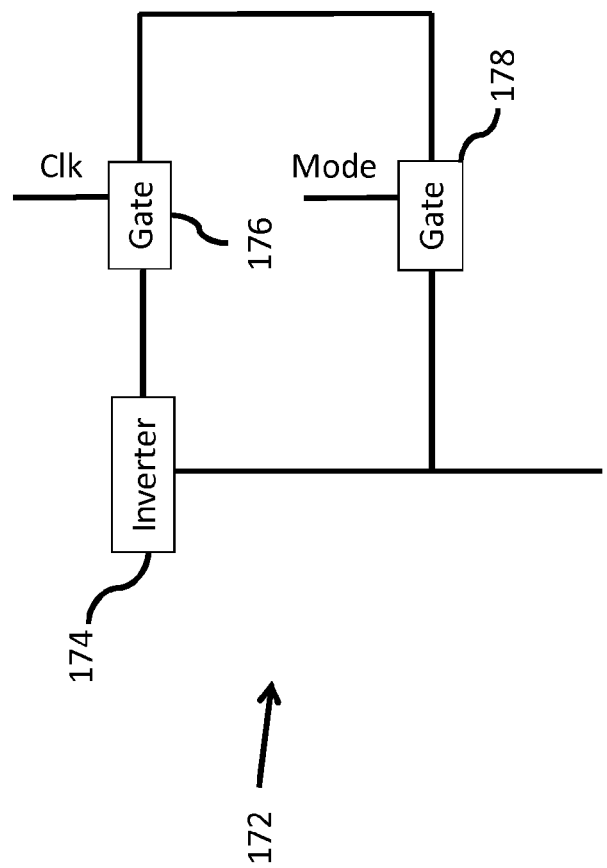
FIG. 4 is a schematic diagram of a feedback loop used in the selectable latch shown in FIG. 3.

FIG. 3 generically shows a selectable latch according to embodiments herein (and more specific illustrations of additional latches are shown in FIGS. 5-20). In FIG. 3, this generic selectable latch has a pair of clock gated parallel gates 162, 164. These parallel gates include a first parallel gate 162 that receives one of the seed signals, and a second parallel gate 164 that receives a data signal. The output of each of the parallel pass gates 162, 164 is connected to a feedback loop 172. The details of the feedback loop 172 are shown in FIG. 4, which is discussed below. The gates in the selectable latches are also connected to output from the first divider (this is actually the clock signal), and the clock signal either opens or closes the gates. The data signal is a received data signal output by a previous latch or feedback circuit in the feedback divider 112.

In the generic selectable latch shown in FIG. 3, a logical circuit 166 (referred to herein as a "second" logic circuit, for clarity) is operatively connected to the parallel gates 162, 164. This logic circuit 166 can be a NAND, NOR, AND, OR, etc., circuit as shown in the specific embodiments in FIGS. 5-20. The second logic circuit 166 performs logic operations in response to signals output by the parallel gates 162, 164 to produce an updated data signal. An additional gate 168 is operatively connected to the second logic circuit 166. The additional gate 168 controls passage of the updated data signal from the second logic circuit 166. Further, an inverter 170 is operatively connected to the additional gate 168. The inverter 170 receives the updated data signal from the additional gate 168, and inverts and outputs the updated data signal as an output data signal. Thus, the selectable latch shown in FIG. 3 has two inputs into the pair of parallel gates 162, 164 and performs one of four logical operations (AND, OR, NAND, or, NOR) based on the received data signals applied to the two inputs.

In the generic selectable latch, the clock signal connected to the parallel gates 162, 164 is a true clock signal that has the same polarity as the PLL clock signal from the first divider, and the clock signal connected to the additional gate 168 is a complement clock signal that has the opposite polarity as the PLL clock signal from the first divider, or vice versa. The parallel gates and the additional gate open and close exclusively from each other. When parallel gates are opened, the additional gate is closed. When the additional gate is opened, the parallel gates are closed. For example, seed and data pass the parallel gates 162, 164 when they are opened, and the logic circuit 166 updates its output accordingly. At the same time, the additional gate 168 is closed, and the updated output from logic 166 is stored inside the latch. When the clock closes the parallel gates 162, 164, the additional gate is opened. Thus, data stored in the latch passes the additional gate and propagates to the output of the selectable latch.

FIG. 4 illustrates an example of a feedback loop. A feedback loop 172 is operatively connected to the output of each of the parallel gates 162, 164 and the additional gate 168. The feedback loop 172 includes an inverter 174 that is operatively connected to a clock-controlled gate 176. The inverter 174 receives the data signal output from its associated gate 162, 164, 168, and inverts and outputs the signal to the clock-controlled gate 176. When the clock enables, the clock controlled gate 176 inverts and outputs the signal to the mode controlled pass gate 178. Otherwise, when the clock disables, the clock controlled gate 176 blocks the signal from the inverter 174. The mode controlled pass gate 178 opens and closes to control the mode of operation of the latch. Data is refreshed by the feedback loop 172 when the mode controlled pass gate 178 is closed and the clock is not toggling, which corresponds to a static latch mode. Feedback is disabled when the mode controlled pass gate 178 is open. Latched data is refreshed periodically by a toggling clock, which corresponds to a dynamic latch mode. The latch in dynamic mode is suitable for high-speed applications while the latch in static mode is suitable for low speed applications. The latch in static mode also has better soft error rate (SER) tolerance. A unified latch with selectable modes in the disclosure can take advantage of both dynamic and static latches, and hence allows a circuit to operate across wide range of frequencies.

FIG. 5 illustrates an example of the generic selectable latch shown in FIG. 3. This latch 180 uses pass gates 182, 184 as the parallel gates and a pass gate 188 as the additional gate.

Further, this latch 180 uses a NOR gate 186 as the logic circuit. An alternative latch 190 is shown in FIG. 6 and is similar to that shown in FIG. 5; however, this latch 190 uses a NAND logic circuit 196. Another latch 200 is shown in FIG. 7, and this latch 200 is similar to that shown in FIG. 5; however, this latch 200 uses an OR logic circuit 226. The latch 210 shown in FIG. 8 is similar to that shown in FIG. 5; however, this latch 210 uses an AND logic circuit 206.

An alternative latch 220 is shown in FIG. 9. This latch 220 is similar to that shown in FIG. 5, except that stacked gates 212, 214 are used as the parallel gates and a stacked gate 218 is used as the additional gate. An alternative latch 230 is shown in FIG. 10, which is similar to that shown in FIG. 9; however, this latch 230 uses a NAND logic circuit 196. In FIGS. 11 and 12 these alternative latches are also similar to FIG. 9; however the latch 240 in FIG. 11 uses an OR circuit 226, and the latch 250 in FIG. 12 uses an AND circuit 206.

Another latch 260 is shown in FIG. 13 that is similar to that shown in FIG. 5, except that stacked gates 212, 214 are used as the parallel gates. The latch 270 shown in FIG. 14 is similar to that shown in FIG. 13, expect that the pass gates 182, 184 are used as the parallel gates, and the stacked gate 218 is used as the additional gate. The latches 280 and 290 shown in FIGS. 15 and 16 are similar to those shown in FIGS. 13 and 14, except that latches 280 and 290 shown in FIGS. 15 and 16 use NAND circuits 196. In addition, latches 300 and 310 shown in FIGS. 17 and 18 are similar to those shown in FIGS. 13 and 14, except that latches 300 and 310 shown in FIGS. 17 and 18 use OR circuits 226. In a corresponding manner, the latches 320 and 330 shown in FIGS. 19 and 20 are similar to those shown in FIGS. 13 and 14, except that latches 320 and 330 shown in FIGS. 15 and 16 use AND circuits 206.

Therefore as shown above, the various selectable latches herein can store one of four states with two logic inputs (embedded NAND, NOR, AND, and OR). These structures eliminate the multiplexor in front of each latch, and hence allow faster latch to latch data transfer. LFSR-based dividers, due to the simplicity of their design, provide for lower area, lower power, and lower cost as compared to traditional binary counter-based designs. LFSR-based dividers have allowed the continued use of traditional digital CMOS design techniques as opposed to more complex and costly techniques (such as CML). The structures disclosed herein are an addition to the LFSR-based divider, and can be used in many high-speed CMOS applications, and significantly reduce data setup time, and hence improve speed.

The devices mentioned herein can be used with integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A selectable latch comprising:
    a pair of parallel gates comprising a first parallel gate receiving a seed signal, and a second parallel gate receiving a data signal;
    a logic circuit operatively connected to said parallel gates, said logic circuit performing logic operations using signals output by said parallel gates to produce an updated data signal;
    an additional gate operatively connected to said logic circuit, said additional gate controlling passage of said updated data signal;
    two inputs, one of said inputs being connected to said first parallel gate and another of said inputs being connected to said second parallel gate;
    a first feedback loop operatively connected to said first parallel gate;
    a second feedback loop operatively connected to said second parallel gate; and
    a third feedback loop operatively connected to said additional gate,
    each of said first, second, and third feedback loops comprising:
        an inverter operatively connected to said gate;
        a clock controlled gate operatively connected to said inverter, said clock controlled gate receiving a feedback data signal from said inverter; and
        a mode controlled gate operatively connected to said clock controlled gate, said mode controlled gate receiving data from said clock controlled gate and outputting data to said inverter,
        said clock controlled gate comprising a stacked gate and said mode controlled gate comprising a pass gate, or
        said clock controlled gate comprising a pass gate and said mode-controlled gate comprising a stacked gate.

2. The selectable latch according to claim 1, said selectable latch performing said logical operation based on signals applied to said two inputs on a received data signal.

3. The selectable latch according to claim 1, said parallel gates comprising stacked gates.

4. The selectable latch according to claim 1, said parallel gates comprising pass gates.

5. The selectable latch according to claim 1, further comprising an inverter connected to said logic circuit, said inverter receiving said updated data signal, inverting said updated data signal, and outputting said updated data signal to said additional gate.

6. The selectable latch according to claim 1, said latch operating as a dynamic latch in a high frequency mode and operating as a static latch in a low frequency mode.

7. A selectable latch comprising:
- a pair of parallel gates comprising a first parallel gate receiving a seed signal, and a second parallel gate receiving a data signal;
- a logic circuit operatively connected to said parallel gates, said logic circuit performing logic operations using signals output by said parallel gates to produce an updated data signal, said logic circuit comprising one of a logic AND circuit and a logic OR circuit, said logic operations comprising one of a logic AND operation and a logic OR operation;
- an additional gate operatively connected to said logic circuit, said additional gate controlling passage of said updated data signal;
- two inputs, one of said input being connected to said first parallel gate and another of said inputs being connected to said second parallel gate;
- a first feedback loop operatively connected to said first parallel gate;
- a second feedback loop operatively connected to said second parallel gate; and
- a third feedback loop operatively connected to said additional gate, each of said first, second, and third feedback loops comprising:
- an inverter operatively connected to said gate;
- a clock controlled gate operatively connected to said inverter, said clock controlled gate receiving a feedback data signal from said inverter; and
- a mode controlled gate operatively connected to said clock controlled gate, said mode controlled gate receiving data from said clock controlled gate and outputting data to said inverter, said clock controlled gate comprising a stacked gate and said mode controlled gate comprising a pass gate, or said clock controlled gate comprising a pass gate and said mode-controlled gate comprising a stacked gate.

8. The selectable latch according to claim 7, said selectable latch performing said logical operation based on signals applied to said two inputs on a received data signal.

9. The selectable latch according to claim 7, said parallel gates comprising stacked gates.

10. The selectable latch according to claim 7, said parallel gates comprising pass gates.

11. The selectable latch according to claim 7, further comprising an inverter connected to said logic circuit, said inverter receiving said updated data signal, inverting said updated data signal, and outputting said updated data signal to said additional gate.

12. The selectable latch according to claim 7, said latch operating as a dynamic latch in a high frequency mode and operating as a static latch in a low frequency mode.

* * * * *